United States Patent [19]
Candy et al.

[11] 3,987,436
[45] Oct. 19, 1976

[54] DIGITAL-TO-ANALOG DECODER UTILIZING TIME INTERPOLATION AND REVERSIBLE ACCUMULATION

[75] Inventors: James Charles Candy, Convent Station; William Herbert Ninke, Holmdel; Bruce Allen Wooley, Colts Neck, all of N.J.

[73] Assignee: Bell Telephone Laboratories, Incorporated, Murray Hill, N.J.

[22] Filed: May 1, 1975

[21] Appl. No.: 573,399

[52] U.S. Cl. .................. 340/347 DA; 179/15 AV
[51] Int. Cl.² ........................... H03K 13/02
[58] Field of Search ............... 340/347 DA, 347 C; 179/15 AV

[56] References Cited
UNITED STATES PATENTS

| | | | |
|---|---|---|---|
| 3,382,438 | 5/1968 | Geller | 325/38 B |
| 3,495,234 | 2/1970 | Price et al. | 340/347 AD |
| 3,541,354 | 11/1970 | Basham | 307/251 |
| 3,560,960 | 2/1971 | Avignon et al. | 340/347 DA |
| 3,579,232 | 5/1971 | Girard et al. | 340/347 DA |
| 3,699,568 | 10/1972 | Thompson et al. | 340/347 DA |
| 3,750,141 | 7/1973 | Poretti et al. | 340/347 DA |
| 3,754,233 | 8/1973 | Sutherland | 340/347 DA |
| 3,893,102 | 7/1975 | Candy | 340/347 DA |
| 3,925,731 | 12/1975 | Brainard et al. | 325/38 B |

OTHER PUBLICATIONS

Kelson et al, "A Monolithic 10-b Digital-to-Analog Converter" IEEE Journal of Solid State Circuits, vol. Sc-8, No. 6, p. 396–408.

*Primary Examiner*—Thomas J. Sloyan
*Attorney, Agent, or Firm*—C. S. Phelan

[57] ABSTRACT

In each character time of a pulse code modulation signal stream, the most significant bit group of the PCM character is reversibly incremented and decremented a plurality of times. The incrementing and decrementing is carried out in a selectable sequence for each discrete pair of subintervals in the character time. The selectable sequences are determined by the value of the least significant bit group of the character whereby the average value, over the character time of an analog signal derived from the changing most significant bit group information in each subinterval, is equal to the value represented by the character.

11 Claims, 5 Drawing Figures

DIGITAL-TO-ANALOG DECODER UTILIZING TIME INTERPOLATION AND REVERSIBLE ACCUMULATION

BACKGROUND OF THE INVENTION

1. Field of the Invention

This invention relates to digital-to-analog decoders, or converters, and it relates, in particular, to such decoders which utilize time interpolation.

2. Description of the Prior Art

Many types of prior art digital-to-analog decoders employ very precise circuit elements in a single type of operation to convert input digital information into analog form with a given degree of resolution. By contrast, however, time interpolation decoders achieve similar resolution by making at least one coarse determination of what a piece of information should be; and they then change that determination in various ways during a given time interval in order to obtain an average analog signal amplitude which equals the value of the input digital information. The philosophy of the time interpolation decoders is to take advantage of the fact that digital techniques allow a fine determination of the time of operation of a circuit with relatively noncritical circuit elements, as compared to utilizing analog techniques entirely in order to make a fine determination of analog signal amplitude. There have been few time interpolation digital-to-analog decoders taught in the prior art. Three examples of such decoders are here noted and all are copending U.S.A. patent applications assigned to the same assignee as the present application.

A first example is the J. C. Candy application Ser. No. 412,296, filed Nov. 2, 1973, now patent No. 3,893,102, and entitled "Digital-to-Analog Converter Using Differently Decoded Bit Groups." In it Candy teaches a digital-to-analog converter illustratively employing a 2-level technique and a single amplitude step from the initial coarse analog value to one higher amplitude at a digitally determined time for establishing the overall analog average value.

A second time interpolation decoder example is that in the copending application of J. C. Candy, S. L. Freeny, and W. H. Ninke, Ser. No. 597,087, filed July 18, 1975, and which is a continuation of their application Ser. No. 421,678, filed Dec. 4, 1973 entitled "Digital-to-Analog Converter with Digitally Distributed Amplitude Supplement" and now abandoned. In that application, a 2-level decoding technique is again employed; but multiple amplitude steps between the aforementioned coarse initial analog value and the one other analog value are employed during a character time to establish the desired average analog amplitude.

The third time interpolation decoder example is included in an R. C. Brainard and J. C. Candy application Ser. No. 461,878, filed Apr. 18, 1974, now Pat. No. 3,925,731, and entitled "Differential Pulse Coded System Using Shift Register Companding." That application teaches a digital-to-analog converter in which the analog signal is derived from a difference pulse coded bit stream. Multiple discrete analog signal levels are obtained from a running digital accumulation operation to produce a stepped analog signal which has the desired average value over a Nyquist period of the underlying analog information represented by the digital input to the converter.

One problem with the prior art digital-to-analog converters for time interpolation systems is that commercial transmission of digital signals between distant points is usually achieved by pulse code modulation (PCM) signals which are formed in accordance with either a linear or a companded coding rule. Thus, bit series decoders of the type in the Brainard et al, decoder cannot be conveniently utilized in commercial systems unless they are preceded by a circuit for restoring the difference pulse coded format. However, such additional code translation circuits usually respond to the full PCM word and, thus, necessarily increase the cost of the decoding operation to a substantial extent. The other decoder examples hereinbefore mentioned work from a PCM digital signal word, but they do not employ the shift register type of accumulation utilized in the coder of the type taught in the aforementioned Brainard et al. application for cooperating with the decoder which is also there taught. That Brainard et al. coder is the only one currently known in the art to use time interpolation as hereinbefore described. Thus, if the decoders of the first and second examples mentioned are employed to operate on a PCM signal format, it is necessary to include an inventory of one type of equipment for coders and a different type of equipment for decoders since, except for resistor networks, the equipment employed is not generally common to the coder and decoder.

SUMMARY OF THE INVENTION

The present invention alleviates at least some of the difficulty of the prior art by reversibly stepping a most significant magnitude bit group representation of a digital character among amplitude levels determined algebraically from the quantity defined by the bit group and predetermined higher and lower quantities. The stepping is carried out in a pattern controlled by the value of the least significant magnitude bit group of the same digital character. The higher and lower quantities are those immediately above and below, respectively, the initial most significant bit group representation in a predetermined ordered incrementing system. An analog signal derived from the varying most significant bit group representation has an amplitude at each step determined algebraically from the binary coded value of the most significant bit group at that step. That analog signal has an average value, over the period during which the digital character is available, which is equal, or directly proportional, to the value of that character.

It is one feature of an embodiment of the invention that the reversible stepping is accomplished by a reversible digital accumulator, e.g. a shift register accumulator, which is clocked at a predetermined rate that is substantially higher than the PCM character rate; and the shift register is provided with direction commands by a simulated difference pulse code modulated signal produced in response to the least significant bit group.

It is a feature of one embodiment of the invention that the simulated difference pulse code modulated signal is utilized so that, in each discrete pair of adjacent clock periods, the accumulator is forced to operate in opposite directions in a selectable sequence for that pair of periods, which sequence depends upon the phase relationship between the simulated difference code and the clock signal.

BRIEF DESCRIPTION OF THE DRAWING

A more complete understanding of the invention and the various features, objects, and advantages thereof may be obtained from a consideration of the following detailed description in connection with the appended claims and the attached drawings in which:

DETAILED DESCRIPTION

Figure 1:
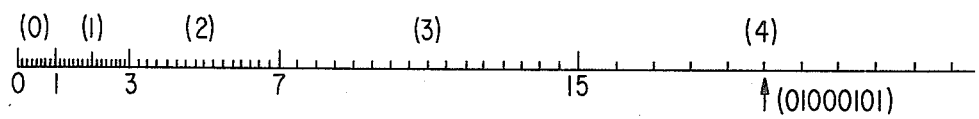
FIG. 1 is a partial scale of positive amplitude levels in a companded PCM coding system utilized in circuits illustrating the present invention.

At the outset it is convenient to describe, in connection with FIG. 1, the companded PCM coding system, or strategy, utilized in the illustrative embodiment of the invention which will be subsequently discussed. Other coding systems can, of course, be utilized in decoders constructed in accordance with the basic principles of the invention.

The illustrative companded coding system is a linear piecewise approximation of a $\mu$-law compression. Only a positive portion of the scale is shown for purposes of illustration. Each companded code segement in FIG. 1 is designated by a boundary number located beneath the scale and a segment number located in parentheses above the scale. The boundary number designates the amplitude level at the lower amplitude boundary of the segment. The boundary number expresses the number of unit-sized amplitude segments in an amplitude level at the designated boundary and wherein the number zero segment is the unit-sized segment. Segments increase in size by powers of two in either direction starting from zero. That is, each segment is twice as large as the next smaller segment in the segment sequence extending out from zero. Each segment is divided into 16 equal intervals; although, for convenience of illustration, only eight are actually indicated in the segment number zero in FIG. 1. Of course, if one were considering a corresponding linear amplitude scale, the ultimate unit amplitude on such a scale corresponds to the interval, rather than the segment, size in the number zero segment of the compressed system. In a uniform, linear, PCM coding system, word of thirteen magnitude bits including one sign bit would be required to define, with comparable maximum resolution, the same amplitude range as an eight bit companded PCM word that also includes a sign bit. In a uniform, linear, PCM system, hereinafter usually called simply a uniform PCM coding system, all amplitude steps are the same size; and the progression through the various steps extends along a straight line.

Assuming a scale of eight positive and eight negative segments for illustrating the present invention, each PCM word advantageously includes a sign bit and seven magnitude bits. Typically, the three most significant magnitude bits constitute the segment number, and the four least significant magnitude bits give the interval number within a named segment. An example of a typical PCM word, utilized in conjunction with the scale of FIG. 1, is shown in that figure for the decimal value of +20 which has the illustrated PCM code word 01000101. In that character the leftmost bit, as illustrated, is the sign bit and indicates the fact that the number represented is positive. The next three bits are the three most significant magnitude bits 100 and indicate, in binary coded form, the segment number four, i.e., starting at the amplitude segment boundary 15. Finally, the four least significant magnitude bits 0101 indicate the interval number five. This point on the scale is designated by the arrow adjacent to the illustrative character in FIG. 1.

Figure 2:
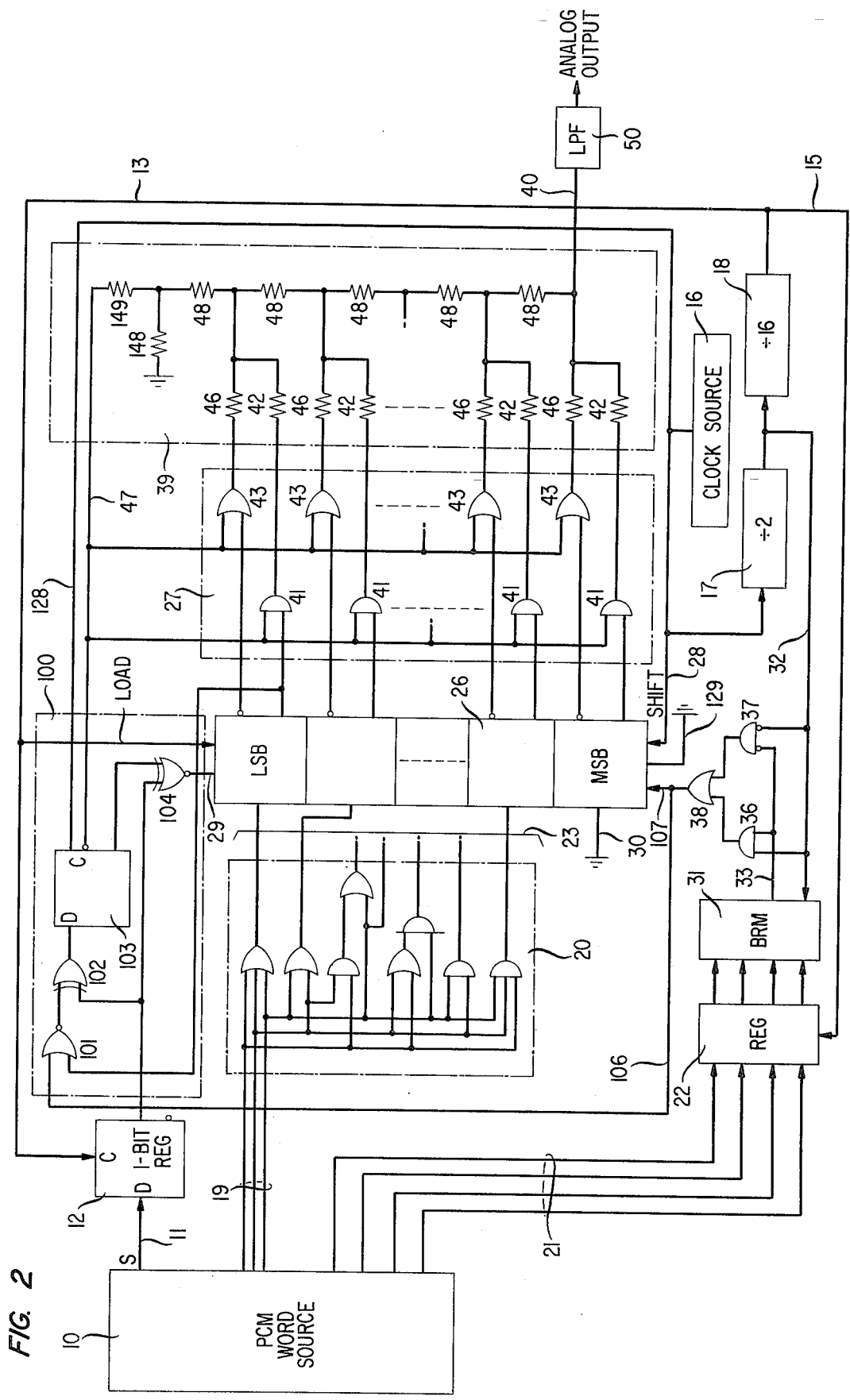
FIG. 2 is a schematic diagram, partially in block and line diagram form, of a digital-to-analog decoder utilizing the present invention.

In FIG. 2 a PCM word source 10 advantageously provides companded PCM words at a predetermined word rate for decoding to analog form. This source could be a transmission line from a remote sending station, not shown, or some other source of the indicated digital characters. These characters are provided in bit parallel from separate outputs of the source 10. The sign bit of each character is provided on a lead 11, otherwise further designated S, and is applied from the source 10 for actuating a 1-bit register 12 which stores the sign information during a character time of the information from the source 10.

Register 12 is advantageously a D type bistable circuit which stores the signal state appearing at its D input connection whenever the circuit is enabled by a clock signal at its C input connection. Registers of this type are well known in the art and provide both true and complement outputs, the complement output being designated schematically by a small circle. The register 12 is enabled at the PCM word rate by a clock signal provided on a clock lead 13. A clock source 16 provides the necessary timing information for the decoder of FIG. 2 and advantageously derives that information from the PCM word source 10 by synchronization recovery circuits, not shown, but which are of any of the types well known in the art for this purpose. The frequency of the output of the clock source 16 is reduced by a factor of two by a frequency divider 17 which drives a further frequency divider 18 that divides by a factor of 16. The output of the divider 18 supplies word rate clock pulses to the lead 13 and to an additional lead 15.

A group 19 of leads couples the three most significant magnitude bits of each word from source 10 to a code translator 20 which will be subsequently described. Similarly, a group 21 of additional leads couples the four least significant magnitude bits from source 10 to static register 22 which is loaded with such information at the PCM word rate by loading pulses applied thereto from the lead 15.

The code translator 20 produces, from the binary coded segment number information on the lead group 19, a corresponding binary coded number in an $n:m$ coding system on translator output leads 23. The latter number is the binary code for the segment boundary number, appearing below the scale in FIG. 1, which corresponds to the segment number appearing in parentheses above the scale in FIG. 1. It will be appreciated by those skilled in the art that the segment boundary numbers each is a binary coded number of $n$ least significant bit binary ONES adjacent to $m$ most significant bit binary ZEROs and where $n$ is the segment number. It is for this reason that the code appearing at the output of the translator 20 is called an $n:m$ code.

That same code is sometimes also called a shift code, or a shift companded code, because it can be incremented or decremented in a shifting, vis-a-vis a counting, operation. This type of code and shift companding are described in regard to an accumulator for a difference pulse coded system in the aforementioned Brainard et al. application.

Code translators such as the translator 20 are known in the art. Nevertheless, one example of such a translator is shown in the aforementioned copending Candy application Ser. No. 412,296 wherein it is shown that combinations of AND and OR gates are employed to produce the necessary translation. In the drawing of the present application, AND and OR gates of a translator of the same type are indicated without further explanation. It is useful to keep in mind that for performing the segment number to segment boundary number translations as hereinbefore noted for the FIG. 1 coding system scale the input leads to the translator 20 are arranged with the least significant bit lead near the top, as illustrated, and successively more significant bit leads arranged in sequence below it. On the output side of the translator, the most significant bit output lead is also near the bottom of the translator, as illustrated; and additional leads of decreasing significance are arrayed in sequence above it so that the least significant bit output lead in the lead group 23 is at the top of that group, as illustrated in FIG. 2.

Since only seven different signal conditions, in addition to the all-ZERO condition, can be designated by the most significant bit group of leads 19, the translator 20 is advantageously provided with seven output leads which are specifically illustrated. Each of the output leads 23 extends to a presetting input connection of a digital accumulator that is employed for incrementing and decrementing the value of the most significant magnitude bit group information from the source 10. The digital accumulator is advantageously an 8-stage reversible shift register 26. The seven output leads 23 from the translator 20 are applied to presetting input connections of the seven least significant stages, respectively, of the shift register 26 for overwriting any prior register contents. The most significant stage is always preset to ZERO as schematically represented by a grounded lead 30. Each stage, of the register 26, has both true and complement outputs which are coupled to polarity selecting logic 27. The complement output of each stage is designated by a small circle adjacent to the stage to which the schematic representation of the corresponding output lead is connected.

The reader's attention is directed to the simplicity of the gate connection in translator 20 which is required to operate on only a part of the bits of each character from source 10. That simplicity is enhanced by the resulting $n:m$ code ruggedness, i.e., it can be further reduced to analog form by relatively imprecise impedance elements. This is in contrast to translators that might be employed in the prior art to reduce PCM, either uniform or companded, to a difference pulse coded format that could make use of the time interpolation type of decoder in the aforementioned Brainard et al. application. It would in the latter situation be necessary to employ, e.g., a large binary rate multiplier, working at an extremely high clock rate, to translate a full uniform PCM word to a difference pulse coded format. If a companded PCM word were involved, it would also be necessary to translate that to the uniform format before the translation to difference coded format.

Figure 3:
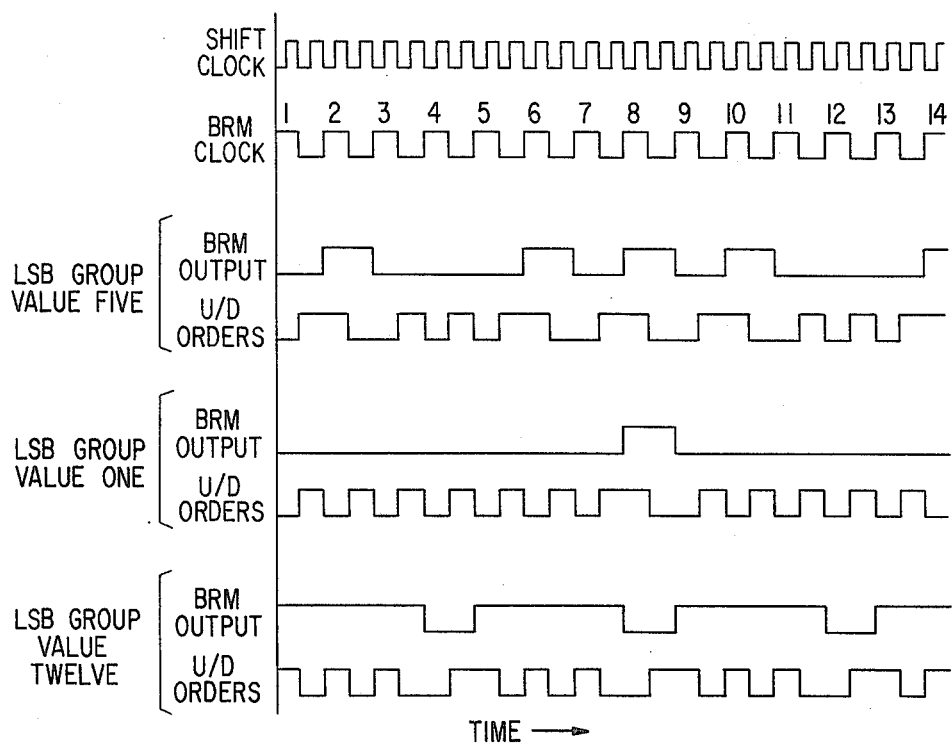
FIG. 3 is a family of timing diagrams taken at different points in the circuit of FIG. 2 for illustrating the operation of the invention.

Shift register 26 is loaded at the word rate with the information contained on the leads 23 in response to word clock signals from the lead 13. Register 26 is caused to operate in a shifting mode by shift clock signals which are supplied on a lead 28 directly from the clock source 16. These clock signals are illustrated in FIG. 3 where each positive going signal excursion extends to an arbitrary binary ONE signal magnitude level. One shifting operation takes place in response to each shift clock pulse, except that the shifting is inhibited by logic circuits internal to the register for a shift clock pulse that coincides with a word clock pulse. Under the latter conditions, the word clock pulse is operative to load the shift register as previously indicated.

The most significant bit stage of shift register 26 is biased, as schematically represented by a grounded lead 129, to inject a binary ZERO into that stage in response to a shifting operation from the most significant bit stage toward the least significant bit stage. In response to a shifting in the opposite direction, from the least significant bit stage toward the most significant bit stage, data is injected into the least significant bit stage along lead 29 from the sign control network 100, which is comprised of the NOR gate 101, the EXCLUSIVE OR gate 102, the 1-bit register 103, and the EXCLUSIVE NOR gate 104. Under most circumstances the data injected into the shift register 26 is a binary ONE. However, if all bits on leads 23 are binary ZERO's when the shift register 26 is loaded from the code translator 20, then during some of the subsequent shift operations it may be necessary to inject a binary ZERO, rather than a ONE, into the least significant bit stage. The operation of the sign control network 100 and the conditions under which the data on lead 29 is changed to a zero will be subsequently described.

A Texas Instruments type SN74198 shift register is an example of a commercially available reversible shift register which has inputs that are controllable for operation in the manner herein described.

The direction of operation of the shift register 26 is controlled by the least significant magnitude bit group of each character from the PCM word source 10. These groups appear at the output terminals of register 22 and are applied to rate selection input terminals of a binary rate multiplier 31. That rate multiplier also receives, by way of a lead 32, a clock signal from the output of the frequency divider 17. Consequently, the multiplier clock signal on lead 32 is at one-half the rate of the shift clock signal applied on lead 28 to the shift register 26. The binary rate multiplier 31 output appears on a lead 33 and is a pulse train having in a character time a number of pulses which is equal to the value of the least significant magnitude bit group stored in register 22. The pulses in that multiplier output signal on lead 33 are approximately evenly distributed over the character time. Leading and trailing edges of each pulse occur in different shift clock times. Examples of such multiplier output signal trains are shown in FIG. 3 for the three cases of least significant group value of 5, 1, and 12. Binary rate multipliers and the nature of their operation are well known in the art. As indicated by the clock patterns in FIG. 3, the frequency dividers 17 and 18 are negative-edge-triggered circuits. Such dividers can be constructed with commercially available bistable circuits of which the Texas Instruments SN74S112 is an example.

Two AND gates 36 and 37 are responsive to combinations of the multiplier clock on lead 32 and the multiplier output on lead 33 for providing through an OR gate 38 direction control commands to register 26. These gates cooperate so that no more than two commands of the same type can occur in sequence. Gate 36 is responsive to a coincidence of logical 1, i.e., positive, input signals; whereas, the gate 37 has two inverting input connections and so responds to a coincidence of no-pulse conditions in the signals on leads 32 and 33 for producing an output pulse from the gate. An OR gate 38 couples the outputs of both of the gates 36 and 37 to the direction-controlling input connection of the shift register 26 via lead 107. Thus, a binary ONE signal from OR gate 38 causes the register 26 to shift toward its most significant bit stage, and the absence of a pulse from gate 38 at the time of a shift command from lead 28 causes the register to shift toward its least significant bit stage. Illustrative segments of direction control commands (U/D orders) from gate 38 for the aforementioned three illustrative cases of different values stored in register 22 are shown in FIG. 3. It will be observed in the latter figure that in each case one command, either pulse or no-pulse, is provided for each shift clock pulse shown on the top line of FIG. 3. One up command (shift toward MSB stage) and one down command (shift toward LSB stage) are provided for each discrete pair of shift clock pulses. A "discrete pair" is here utilized to mean a pair of clock pulses which includes only successive clock pulses which are not included in any other pair of clock pulses.

Within any pair of up-down commands, the order in which the commands are given depends upon the phase relationship between the binary rate multiplier clock signal on lead 32 and the binary rate multiplier output signal on lead 33 in each period of the latter signal. It can be seen in FIG. 3, that, if the up-down commands are considered bipolar signals, each multiplier output pulse causes one polarity violation at its leading edge and one at its trailing edge. That is, each multiplier output pulse leading edge causes a departure from a normal down-up command sequence to the up-down sequence and the trailing edge causes a restoration of the down-up sequence. Consequently, starting from any given digital value in shift register 26, the shift register can operate in a range extending from one higher accumulation step to one lower accumulation step in the ordered accumulation, or incrementing, algorithm of the device, i.e., of shift register 26. In other words, the shift register is limited so it can assume different ones of only the three values in that range at different points in the character time as will be further discussed subsequently in regard to FIG. 4. In the case where the shift register 26 is filled entirely with ZEROs, if a shift down command (a ZERO) is received on lead 107, a step to a lower magnitude of accumulation is not possible. Instead, the sign bit controlling logic circuit 27 and resistor network 39 must be changed. This is accomplished by the sign control network 100. In this network the NOR gate 101 is controlled by the least significant bit of the shift register 26, via lead 105, and the direction control command on lead 106 from the output of gate 38. When the output of NOR gate 101 is a ZERO, information in register 12 is passed directly through the EXCLUSIVE-OR gate 102 to the 1-bit register 103, which is loaded in response to pulses on lead 128 from the clock source 16. If the output of gate 101 is a ONE, which occurs only when both the least significant bit of shift register 26 and the direction control output of gate 38 are ZERO, the output of register 12 is complemented by gate 102 before being fed to register 103. Thus, the sign bit as held in register 103 is changed.

In the case where all bits in shift register 26 are ZERO, and down shift occurs causing the change in sign described above, the next direction command appearing at the output of gate 38 will necessarily be a shift up command. In this situation however, a ONE is not to be shifted into the least significant bit stage of the shift register. Instead only a change of sign to the original state, as retained in register 12, is required. To avoid shifting a ONE into shift register 26 on lead 29, the EXCLUSIVE-NOR gate 104 is used to compare the true outputs of registers 12 and 103. If the information in these registers is the same, a ONE appears on lead 29. However, if the information differs, owing to a change in the data of register 103, then a ZERO appears on lead 29 and, on the subsequent shift up command, is shifted into the least significant bit stage of register 26.

The polarity selecting logic circuit 27 couples outputs of the respective stages of shift register 26 to input terminals, or tape, of a resistance ladder network 39 for producing from the ladder network an analog output signal on a lead 40. A ZERO for the sign bit on lead 11 represents a positive number, and the complement output of register 103 is used in controlling the logic circuit 27 and the ladder network 39. The analog signal on lead 40 has a different amplitude for each different set of binary coded bits in the shift register 26. Logic circuit 27 includes a set of AND gates 41, four of which are specifically illustrated in FIG. 2. These gates are enabled by a binary ONE complemented output from the register 103, corresponding to a positive sign; and, when enabled, each gate couples the true binary ONE (stage set) output of its corresponding stage of the shift register to a rung resistor 42 in the network 39. In addition, the logic circuit 27 includes a set of OR gates 43, each of which couples either the complementary output of its corresponding shift register stage or a binary ONE complemented output from register 103 to another rung resistor 46 in the network 39. Each pair of gates 41, 43 is a tap coupling circuit. Each of the gates 41 and 43 provides, when activated, a binary ONE output signal of the same magnitude for all such gates. That magnitude is advantageously selected as will be hereinafter described.

Considering the operation of the logic circuit 27, assume first that a positive complemented output is provided by register 103 on lead 47. At this time the AND gate 41 for each stage is enabled and couples the true state of its corresponding stage to the resistor network 39. At the same time, the binary ONE sign bit complement on lead 47 is coupled through each of the gates 43 to the network 39 as a fixed pedestal voltage signal regardless of the state of the information in the particular register stage. On the other hand, if the sign bit complement on lead 47 is a binary ZERO, the AND gates 41 are disabled and the OR gates 43 couple the complementary form of the shift register stage states to the resistance network 39. Thus, at any shift register stage, if the sign bit complement on lead 47 is a binary ONE, two units of current are provided to the resistance network 39 if the register stage is in the set (binary ONE) condition; but only one unit is provided, i.e., by way of the OR gate 43, if the stage is in the reset (binary ZERO) condition. Similarly, if the sign bit complement from register 103 is a binary ZERO, no units of current are provided to the network 39 when the shift register stage is set; and one unit is provided when the stage is reset. The total effect of one of three possible sign-influenced levels appearing at each ladder tap produces on lead 40 each of the aforementioned different amplitudes, all of which are positive. The equivalent bipolar signal can be derived by subtractive bias or capacitive coupling neither of which is specifically shown. The fact that two out of four mentioned conditions supply a single unit of current from a stage is not an ambiguity because the one unit case when lead 47 is in the high signal state presents a one-unit pedestal that distinguishes one polarity of the input digital information from the other. The sign bit is also coupled to the least significant bit end of ladder network 39 by way of a lead 47 to provide current which is added to the ladder network to set the analog step level offset from the adjacent segment boundary level, e.g., the plus and minus one third offset from the number zero boundary as hereinafter discussed.

The resistance ladder network 39 is advantageously a so-called R/2R network. That is, resistors 48 are connected in series between the output lead 40 and ground in what may be considered the beam on one side of a ladder. Each pair of rung resistors 42, 46 has one end of those resistors connected together and to a single tapping point between a pair of the beam resistors 48. The beam resistors 48 all have the same resistance R and the rung resistors 42 and 46 all have the same resistance 4R. In a conventional R/2R network wherein there is only a single resistor per rung, that resistor has a resistance value 2R; but in the present bipolar signal embodiment where two voltage inputs are applied in parallel to each ladder tapping point, each rung resistor has the resistance 4R. In addition, the sign bit provided on lead 47 is coupled into the ladder network through a resistor 149 having the 4R resistance magnitude to give the aforementioned ±⅓ amplitude displacement at the origin. Resistor 149 is connected to the ungrounded terminal of a resistor 148 having a resistance 4R/3 and which is otherwise connected to ground. That resistance of resistor 148 is chosen to match the rest of the ladder with resistor 149 in the circuit.

As is well known in the art, circuits providing input signals to rung resistors of a ladder network are biased so that the analog signal output on lead 40, at any given time, corresponds to the binary coded value then stored in the shift register 26. However, in situations where that stored value is represented in the n:m type of code, and where an R/2R network is employed, the bias for the supply circuits, i.e., the binary ONE output level for gates 41 and 43, is selected so that the analog output at lead 40 has an amplitude which is within the coding segment having its lower boundary amplitude defined by the value in shift register 26. The position of that analog step level in that segment is algebraically determined such that it is at a level which is at the same amplitude distance from each adjacent boundary of the segment as is a corresponding amplitude step on the opposite side of the respective boundary in the ordered sequence of the accumulation algorithm. Thus, for the companded n:m coding system where $n$ is the segment number, $b$ is the segment boundary value, and $b = 2^n-1$, the analog output voltage V for each step is $V = (2^{n+2}-3)/3$. That offset is implemented by the effect of the resistor 149 and the lead 47 signal as previously mentioned. That is, for the segment number zero V = ⅓.

On the other hand, if source 10 provides uniform PCM signal, translator 20 is appropriately modified to produce the n:m code for the boundary value $b$ of each designated segment number $n$ where $b = n$. Resistor network 39 takes the form of a resistor tree in which resistors 48 and 148 are eliminated, and the resistors 42, 46 and 149 all have the same resistance and all have their free, or beam, end connected directly to lead 40. Then the output on lead 40 corresponding to each boundary value is displaced midway within the designated setment at a voltage $V = n+½$.

Figure 4:
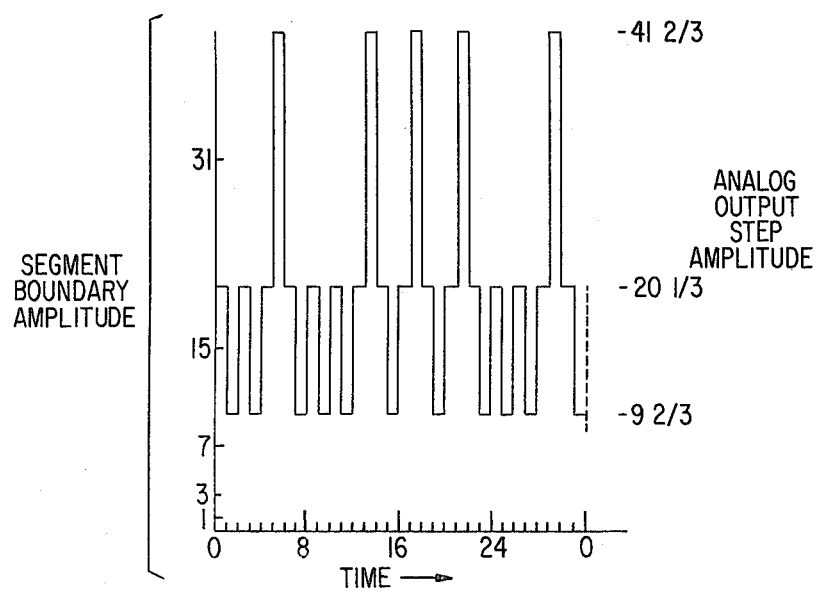
FIG. 4 is a wave diagram of a discrete stepped analog approximation produced before filtering in the circuit of FIG. 2.

FIG. 4 illustrates the relative signal conditions for the aforementioned example shown in FIG. 1, i.e., wherein the most significant magnitude bit group of an input character is 100 in binary code to represent segment number 4, as shown in FIG. 1. That segment has its lower boundary level at 15 amplitude units (shown on the left-hand ordinate scale in FIG. 4). With the value 15 in shift register 26, the amplitude step level appearing on lead 40 is at twenty and one-third amplitude units, i.e., five and one-third units above the level 15 (as shown on the right-hand ordinate scale in FIG. 4). The amplitude step below the level 15 segment boundary is 9⅔ units, and is 5⅓ units below the level 15. Similarly, if the boundary level 31 were in shift register 26, the output analog amplitude steps below and above that level are 20⅓ and 41⅔, i.e., 10⅔ amplitude units on either side of the boundary level 31. Thus, for the illustrative example of a binary character value of +20, and a least significant magnitude bit group value of 5, the sequence of up-down commands is shown in part in FIG. 3 for the FIG. 4 sequence between times three and twenty-nine. Those commands drive the shift register 26 up and down one step at a time on either side of the initial value of 15. The stepped analog output on lead 40 steps from the initial value of 20⅓ down to 9⅔ and up to 41⅔ in a particular sequence shown in FIG. 4 and directed by those up-down commands from gate 38. The result of this particular sequence of analog signal stepping is that the average of the analog values on lead 40, over the 32 steps which take place in a character time, is exactly the +20 value of the digital PCM word from source 10.

A low-pass filter 50 in FIG. 2 receives its input from the lead 40 and is provided for smoothing the stepped analog signal on that lead. For this purpose the filter 50 has a cutoff frequency at about one-half the character rate of digital characters from the source 10.

Figure 5:
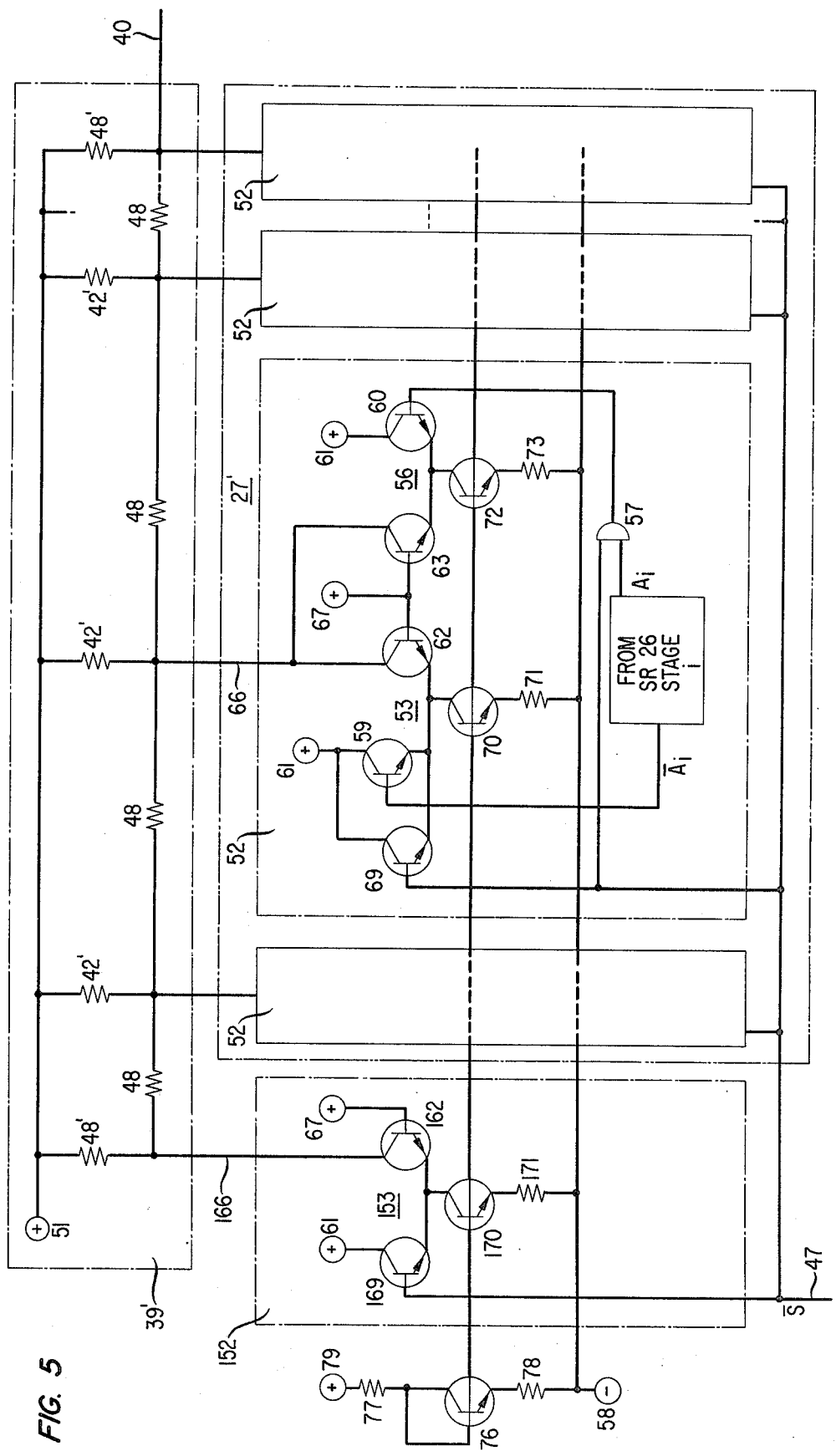
FIG. 5 is a modified circuit for applying pulse coded signals to a resistance ladder network.

FIG. 5 shows a modified logic circuit 27' which is useful for coupling the output of shift register 26 in FIG. 2 to operate a resistance ladder network when the full circuit 27' can be fabricated as one integrated circuit. Logic circuit 27' is advantageous for some circuit operations because it is easier in its integrated circuit, constant current source environment to obtain approximately equal, corresponding, positive and negative (if biased or capacitively coupled), analog amplitude steps than can be realized in the case of the logic circuit 27 utilized in FIG. 2 for purposes of explaining the present invention. In the logic circuit 27, it is necessary to balance the outputs of the AND and OR gates which supply signals to each tap in the resistance ladder network in order to be sure to obtain the exact integral units of current at the end of each dual-resistor rung, and thereby assure accuracy of the voltage level ultimately produced at the output lead 40. Gate voltage sources can be balanced, but small variations in switch resistances of gates 41 and 43 can destroy the balance effect and make the analog signal in the output of filter 50 noisy. The employment of constant current sources in circuit 27' of FIG. 5 avoids this problem.

In the FIG. 5 logic circuit 27', the complemented sign bit input on lead 47 and the eight magnitude bit inputs in the $n:m$ code are utilized as before. However, the amplitude information is now provided directly to each beam tap in the ladder network rather than through the dual rung resistors utilized in FIG. 2. Consequently second harmonic distortion produced in the analog output signal is reduced. Also in FIG. 5, the resistance ladder network 39' is current driven rather than voltage driven. That is, the magnitude information is applied directly to the ladder beam taps, at terminals of resistors 48, rather than being applied to those taps through the rung resistors. All rung resistors 42', except the two resistors 48' at each end of the ladder, have the 2R magnitude. The two end resistors 48' have the R resistance magnitude. Ends of the rung resistors which are remote from the ladder beam resistor connections are all connected together and to a source 51 of positive potential. End resistors 48' are included in the latter connection. Source 51 is schematically represented by a circled polarity sign representing the polarity of a corresponding terminal of any suitable direct potential source which has a terminal of opposite polarity connected to ground. Similar source designations are utilized throughout FIG. 5.

Magnitude control and polarity control of the drive at each tapping point of the current driven resistance network 39' are exercised through one of the tap circuits 52. Since all of those circuits are of the same design, only one is shown in detail in FIG. 5. A similar, but simplified, tap circuit 152 is used to couple the sign bit information, on lead 47 to the end of the resistance network adjacent to the least significant bit tap. In the tap circuit 52, there is provided a pair of transistor differential amplifiers 53 and 56 each having an identical constant current source connected in its common emitter lead to a source 58 of negative potential. The two amplifiers include two transistors 59 and 60, respectively, which have their collector electrodes connected to a source 61 of positive potential to function as current sinking paths. Similarly, the amplifiers have additional transistors 62 and 63, respectively, which have their individual collector electrodes connected together to be coupled by a lead 66 to a tapping point between beam resistors of the ladder network 39'.

A binary magnitude bit from a stage $i$ of the shift register 26 in FIG. 2 controls transistors 59 and 60 in FIG. 5. The true form $\overline{A_i}$ of the bit is coupled through an AND gate 57 to the base electrode of transistor 60, and the complement form $A_i$ of the bit is coupled directly to the base electrode of transistor 59 which acts as a supplemental current sinking path. Base electrodes of transistors 62 and 63 are connected together to a source 67 of positive potential which biases those base electrodes at a voltage which is approximately midway between the voltages of the binary ONE and ZERO signal levels from the stage $i$. Thus, the transistor 62 conducts only when the other side of the amplifier 53 is nonconducting. Similarly, transistor 63 conducts only when the other side of amplifier 56 is nonconducting.

Transistor 62 is additionally influenced by the inverted sign bit $\overline{S}$ which is applied from lead 47 to each of the tap circuits 52. Within each tap circuit, that inverted sign bit is applied as a second input to the gate 57. It is also applied to the base electrode of a transistor 69 which has its collector-emitter path connected in parallel with the same path of transistor 59.

Emitter electrodes of transistors 59, 69, and 62 are connected together and further connected through the collector-emitter path of a transistor 70 and a current defining resistor 71 to the source 58 of negative potential. Similarly, emitter electrodes of transistors 60 and 63 are connected together and further connected through a transistor 72 and a resistor 73 to the same source. The transistors 70 and 72 have their base electrodes connected together to the base electrode of a diode-connected transistor 76 which is connected in series between potential divider resistors 77 and 78 which are further connected between a source 79 of positive potential and the negative source 58. Thus, the circuit of transistor 76 fixes the base bias level for all of the constant current source transistors 70 and 72 in all of the tap circuits 52. Resistors 71 and 73 are identical thereby resulting in identical collector currents for the current source transistors 70 and 72.

Within the amplifier 53, the transistor 59 is controlled by the data bit from stage $i$ to be conducting in response to a binary ZERO, i.e., $\overline{A_i}$ high; and transistor 69 is controlled by the inverted sign bit to conduct in response to a positive sign (S equal ZERO), i.e., a binary ONE $\overline{S}$. Thus, if either transistor 59 or transistor 69 is conducting (the character sign is positive or the data bit is a binary ZERO), such transistor takes the full amplifier 53 current and locks the transistor 62 in the nonconducting condition. When the sign bit is negative and the data bit is a binary ONE, transistors 59 and 69 are nonconducting and transistor 62 draws through lead 66 the single unit of current which amplifier 53 can accommodate.

In similar fashion in amplifier 56, transistor 60 is biased into conduction in response to the coincidence of a positive sign bit and a binary ONE data bit, i.e., coincidence of $\overline{S}$ and $A_i$ high. In that condition, transistor 60 causes transistor 63 to be locked in the nonconducting condition. If either the sign bit is negative or the data bit is a binary ZERO, transistor 60 is nonconducting and transistor 63 draws the full unit of current which amplifier 56 can accommodate.

It can then be seen that there is no current in lead 66 for a binary ONE in the bit $i$ of a positive character. One unit of current will be present in lead 66 for a binary ZERO bit $i$ in either a positive or a negative character. Two units of current will be present in lead 66 for a binary ONE bit $i$ in a negative character.

The sign bit tap circuit 152 contains a single differential amplifier 153 having a constant current source connected in its common emitter lead to the source 58 of negative potential. Transistor 169 in the amplifier has its collector electrode connected to the source 61 of positive potential. The collector electrode of transistor 162 in the amplifier is connected to an end tapping point of the ladder network 39' by lead 166. The base electrode of transistor 162 is connected to the source of positive potential 67 that lies approximately midway between the binary ONE and ZERO signal levels of the inverted sign bit $\overline{S}$. The base electrode of transistor 169 is driven by the inverted sign bit $\overline{S}$ on lead 47. For a positive sign (i.e., $\overline{S}$ a binary ONE) transistor 169 takes the full amplifier 153 current and locks transistor 162 in the nondonducting condition. If the sign bit is negative, transistor 169 is nonconducting and transistor 162 draws through lead 166 the single unit of current available through amplifier 153. Thus, there is no current in lead 166 for a positive character, and one unit of current will be present for a negative character.

The emitter electrodes of transistors 169 and 162 are connected through the collector-emitter path of a transistor 170 and a current defining resistor 171 to the source 58 of negative potential. The base electrode of transistor 171 is connected to the base of transistor 76 and thus the base bias level is the same as for transistors 70 and 72 in the tap circuits 52. Resistor 171 is identical to resistors 71 and 73 in circuits 52. Thus, the constant current source in the curcuit 152 is identical to those in the circuit 52.

The foregoing unit current conditions for binary ONE and ZERO magnitude bits in positive and negative input characters correspond to the similar conditions previously outlined in connection with FIG. 2. That is, a tap in the resistance network can receive 0, 1, or 2 units of current as may be necessary to determine bipolar analog signals. However, with the circuit of FIG. 5 there is less second harmonic content in the analog output at lead 40 since only a single resistor is employed for each rung of the ladder network. Also, this circuit is better suited to economical realization as a single silicon integrated circuit.

Although the invention has been described in connection with particular embodiments thereof, it is to be understood that additional embodiments, modifications, and applications are included within the spirit and scope of the invention.

What is claimed is:

1. A decoder for producing a stepped analog signal from a companded pulse code modulation character having a plurality of magnitude bits, the signal having an average analog value over the character time which is substantially equal to the coded value of the character, said decoder comprising
    means for translating a first most significant group of said magnitude bits, representing in binary code the number of an amplitude segment in the coding system of said character, into an *n:m* code character representing in binary code the amplitude of a level at a boundary of said segment,
    a reversible shift register,
    means for coupling shift clock signals to said shift register,
    means for loading the *n:m* code character into said reversible shift register to overwrite all prior contents,
    means for deriving from said shift register an output analog signal having an amplitude corresponding by a predetermined algebraic rule to the analog information value represented by the contents of said shift register,
    means, responsive to a second less significant group of magnitude bits representing in binary code the number of an interval within said segment in said coding system, for producing a train of pulses having in said character time a number of pulses equal to said interval number, and
    means, jointly responsive to said shift clock signals and said train of pulses, for controlling the direction of operation of said shift register to have one shift in each direction in response to each pair of adjacent clock signals, said rule being selected so that said output analog signals during said clock signals in said character time have said average analog value.

2. A decoder for producing a stepped analog signal from a pulse code modulation character, which signal has an average analog value over the character time which is substantially equal to the coded value of the character, said decoder comprising
    means for reversibly accumulating digital information,
    means for presetting said accumulating means to a binary coded value corresponding to the value of analog information represented by a most significant bit portion of said character,
    means for actuating said accumulating means to increment or decrement said preset coded value one step at a time, in a three-step range in which said preset value is the intermediate step, in an ordered incrementing system, during each of plural periodically recurring time intervals between successive presettings of said accumulating means,
    means responsive to a least significant bit portion of said character, for controlling the pattern of incrementing and decrementing functions during said intervals, and
    means for deriving from said accumulating means an analog signal having an amplitude in each of said intervals corresponding to the value at that time of the binary coded contents of said accumulating means.

3. The decoder in accordance with claim 2 in which said controlling means comprises
    means for limiting said functions to a three-level range extending one accumulating step above said preset value and one accumulating step below said preset value.

4. The decoder in accordance with claim 3 in which said limiting means comprises
    means for forcing said accumulating means to step up one step and step down one step in a selectable order in each discrete pair of successive ones of said intervals, and
    means, responsive to said least significant bit portion, for selecting said order so that said average analog value is substantially equal to said coded value of the character.

5. The decoded in accordance with claim 2 in which said accumulating means comprises a reversible shift register connected to be shifted in response to said actuating means, and
    said controlling means comprises
    means for generating a train of pulses having a number of pulses therein equal to the value of said least significant bit portion during said character time, and
    means responsive to said pulses and to said actuating means, for determining the direction of operation of said shift register.

6. The decoder in accordance with claim 5 in which said determining means comprises
    first and second AND logic gates, said second gate having only inverting input connections,
    means for applying said pulse train and a binary output of said actuating means to actuate said first gate in response to a coincidence of a first binary signal state in both said pulse train and said output.

means for applying said pulse train and said output of said actuating means to actuate said second gate in response to a coincidence of a second binary signal state in both said pulse train and said output, and means for coupling outputs of said first and second gates to said shift register for causing the shift register to operate in a first direction in response to actuation of either of said gates and in a second direction in response to actuation of neither of said gates.

7. The decoded in accordance with claim 2 in which said accumulating means comprises an $n$-stage reversible shift register connected to be actuated for shifting in response to an output of said actuating means in a direction determined by said controlling means, means for loading the $n-1$ least significant stages of said register in response to said presetting means, means for biasing the most significant stage of said register to the binary ZERO state in response to each shifting operation toward its least significant stage, and means for biasing said least significant stage of said register to the binary ONE state in response to a shifting operation toward said most significant stage.

8. The decoder in accordance with claim 7 in which said least significant bit stage biasing means includes means for inhibiting such biasing means in response to coincidence of a binary ZERO state in said stage and a sequence of decrementing and incrementing controls, in that order, from said controlling means.

9. The decoded in accordance with claim 2 in which the pulse code modulation character includes magnitude bits and a sign bit, said least significant and most significant bit portions of said character including only magnitude bits, and said deriving means comprises a resistance ladder network including a plurality of resistors connected in series between a reference potential terminal and an output terminal of said decoder, said potential divider having electric circuit tapping points at said output terminal and at a plurality of additional terminals between different pairs of said resistors, means for coupling said sign bit to said potential divider at a tapping point adjacent to said reference potential terminal, and a plurality of tap circuits for coupling respective bit signals from said accumulating means to corresponding ones of said tapping points, each of said tap circuits including a pair of differential amplifier current switches each including a constant current source providing a fixed predetermined unit of current which is the same for both of said amplifiers in all of said tap circuits, each of said amplifiers having one selectable current path thereof connected from its current source to the tapping point for such tap circuit and having another selectable current path connected from its current source to a current sinking path, and means responsive to predetermined combinations of signal states of said accumlating means bit and of said sign bit for selecting which path in each of said differential amplifiers is to carry the unit of current of such amplifier and thereby selecting the number of current units in said tapping point for the tap circuit.

10. The decoder in accordance with claim 2 in which the controlling means comprises means for providing clock signals at one-half of the frequency of recurrence of said time intervals, means, responsive to said clock signals for generating a pulse train having a pulse recurrence rate determined by said least significant bit portion of said character, leading and trailing edges of each pulse of said train occurring during different ones of said intervals, and means responsive to a coincidence of like binary signal states in said pulse train and in said clock signals for directing said actuating means to increment and responsive to coincidence of different binary signal states in said pulse train and in said clock signals for directing said actuating means to decrement whereby no more than two like ones of said functions can occur in succession.

11. A digital-to-analog decoder for producing a stepped analog signal from each of a plurality of pulse code modulation words, and in which the average value of the output over a pulse code modulation work time is substantially equal to the value of the decoder input work at that time, and in which the bits of such input word are segregated into a first group of most significant bits and a second group of least significant bits, the least significant one of those bit groups being utilized to control the operation of a binary rate multiplier, and the decoder being CHARACTERIZED IN THAT, a code translator converts the most significant bit group of each pulse coded word into a shift companded code word, the translator output is loaded into a reversible shift register at the pulse code word rate, and logic circuits are provided for recurrently reversing the direction of operation of the shift register during each pulse code word time in accordance with the output of the binary rate multiplier and a clock signal occurring at one-half of the shift clock rate of the shift register, such logic circuits causing the register to shift either in a first or in a second direction at shifting times thereof if the binary rate multiplier output and the one-half clock rate signals are either in the same binary signal state or in different binary signal states, respectively.

* * * * *

UNITED STATES PATENT AND TRADEMARK OFFICE
CERTIFICATE OF CORRECTION

PATENT NO. : 3,987,436
DATED : October 19, 1976
INVENTOR(S) : James C. Candy, William H. Ninke, and Bruce A. Wooley It is certified that error appears in the above-identified patent and that said Letters Patent are hereby corrected as shown below:

Column 3, line 34, "segement" should read --segment--. Column 8, line 27, "tape" should be --taps--. Column 11, line 56, "$\overline{A_i}$" should read --$A_i$--; line 58 "$A_i$" should read --$\overline{A_i}$--. Column 13, line 2, "nondonducting" should read --nonconducting--. Column 14, line 49, "decoded" should read --decoder--; line 68 "output." should read --output,--. Column 15, line 11, "decoded" should read --decoder--; line 34, "decoded" should read --decoder--.

Signed and Sealed this

First Day of March 1977

[SEAL]

Attest:

RUTH C. MASON
*Attesting Officer*

C. MARSHALL DANN
*Commissioner of Patents and Trademarks*